United States Patent [19]

Gamo

[11] Patent Number: 5,294,860
[45] Date of Patent: Mar. 15, 1994

[54] PIEZOELECTRIC FILTER

[75] Inventor: Masao Gamo, Nagaokakyo, Japan

[73] Assignee: Murata Manufacturing Co., Ltd., Japan

[21] Appl. No.: 951,580

[22] Filed: Sep. 25, 1992

[30] Foreign Application Priority Data

Sep. 26, 1991 [JP] Japan .................................. 3-247474

[51] Int. Cl.$^5$ ............................................ H01L 41/08
[52] U.S. Cl. ...................................... 310/320; 310/366
[58] Field of Search ........................ 310/320, 357, 366

[56] References Cited

U.S. PATENT DOCUMENTS 5,057,801 10/1991 Kittaka et al. ...................... 310/320
5,065,066 11/1991 Nakatani et al. .................... 310/320
5,084,647 1/1992 Inoue et al. ........................ 310/359

Primary Examiner—Mark O. Budd
Assistant Examiner—Thomas M. Dougherty
Attorney, Agent, or Firm—Ostrolenk, Faber, Gerb & Soffen

[57] ABSTRACT

A piezoelectric filter in which an earth electrode is provided in the center of a piezoelectric substrate in the direction of thickness; an input electrode is provided on the upper surface of the piezoelectric substrate so as to be opposed to one part of the earth electrode; an output substrate is provided on the lower surface of the piezoelectric substrate so as to be opposed to another part of the earth electrode except the aforementioned one part; a first dummy electrode is formed on the upper surface of the piezoelectric substrate so as to be opposed to the output electrode through the piezoelectric substrate; and a second dummy electrode is formed on the lower surface of the piezoelectric substrate so as to be opposed to the input electrode through the piezoelectric substrate.

10 Claims, 5 Drawing Sheets

PIEZOELECTRIC FILTER

BACKGROUND OF THE INVENTION

1. Field of the Invention

The present invention relates to a piezoelectric filter of an energy-trapped type using a second harmonic wave of the thickness-extensional vibration mode.

2. Description of Related Art

FIGS. 8 and 9 show a conventional piezoelectric filter of an energy-trapped type using a second harmonic wave of the thickness-extensional vibration mode.

As shown in FIG. 8, in a piezoelectric filter 1, an earth electrode 3 is arranged in the center, in the direction of thickness, of a piezoelectric substrate 2, which is polarized in the direction of thickness as indicated by the arrows. On the upper surface 2a of piezoelectric substrate 2, an input electrode 4 is formed so as to be opposed to a part of the earth electrode 3 through a piezoelectric substrate layer. On the other hand, an output electrode 5 is formed on the lower surface 2b of piezoelectric substrate 2. The output electrode 5 is formed so as to be opposed to the other part of the earth electrode 3 through a piezoelectric substrate layer, and is positioned so as not to overlap with the input electrode 4 through the piezoelectric substrate 2.

FIG. 9 is an exploded perspective view showing plane shapes and relative locational positions of the aforementioned earth electrode 3, input electrode 4, and output electrode 5. In FIG. 9, the output electrode 5 is shown by the lower surface 2b of the piezoelectric being projected below.

The aforementioned conventional piezoelectric filter 1 is a double-mode filter using a second harmonic wave of the thickness-extensional vibration mode and is intended to be used in a high-frequency region.

Although the piezoelectric filter 1 provides the energy-trapped type of piezoelectric filter operable in a high-frequency region, its insertion loss is relatively large and, therefore, a reduction of such insertion loss is desirable.

Furthermore, in the aforementioned piezoelectric filter 1, a reduction of matching impedance also has been desired so that the piezoelectric filter has application to wider uses. In order to reduce the matching impedance, it has been considered to increase the area of the electrodes in the piezoelectric filter 1, that is, the area of the earth electrode 3 and the input and the output electrodes 4 and 5. However, an increase in the electrode area leads to the reduction of matching impedance, accompanied by a problem of deterioration of the characteristics, which is caused by the enhancement of the level of unwanted spurious vibration.

SUMMARY OF THE INVENTION

An object of the present invention is to provide a piezoelectric filter having a structure which can reduce insertion loss and lower matching impedance without increasing the level of unwanted spurious vibration.

A piezoelectric filter according to the present invention is a piezoelectric filter of an energy-trapped type using the thickness-extensional vibration mode, comprising a piezoelectric substrate, an earth electrode formed in the center of the piezoelectric substrate in the direction of thickness, an input electrode formed on one major surface of the piezoelectric substrate so as to be opposed to one part of the earth electrode through a layer of the piezoelectric substrate, an output electrode formed on the other major surface of the piezoelectric substrate so as to be opposed to the other part of the earth electrode, except the one part, through a layer of the piezoelectric substrate, and a dummy electrode formed on the one major surface of the piezoelectric substrate so as to overlap with the output electrode through the piezoelectric substrate and/or on the other major surface of the piezoelectric substrate so as to overlap with the input electrode through the piezoelectric substrate.

In the piezoelectric filter according to the present invention, the dummy electrode is formed so as to overlap, through the piezoelectric substrate, with at least one of the input electrode and the output electrode which are respectively formed on both major surfaces of the piezoelectric substrate so as not to overlap with each other. Thus, the symmetry of electrode structure in the piezoelectric filter is enhanced so as to improve an energy-trapped state, thereby increasing a mechanical Q value of the piezoelectric filter. As a result, the insertion loss is reduced and the matching impedance is lowered without increasing the level of unwanted spurious vibration.

According to the present invention, in the double-mode piezoelectric filter using a second harmonic wave of the thickness-extensional vibration mode, the earth electrode is formed in the center of the piezoelectric substrate in the direction of thickness, the input electrode and the output electrode are respectively formed on both major surfaces so as to be partially opposed to the earth electrode so as and not to be opposed to each other, and the dummy electrode is formed so as to be opposed to the input electrode and/or the output electrode through the piezoelectric substrate. Thus, the symmetry of electrode structure in the piezoelectric filter is enhanced, thereby reducing the insertion loss and lowering the matching impedance.

Accordingly, the matching impedance can be lowered without increasing the area of the electrodes, and the unwanted spurious vibration is not enhanced.

DESCRIPTION OF THE PREFERRED EMBODIMENTS

Figure 1:
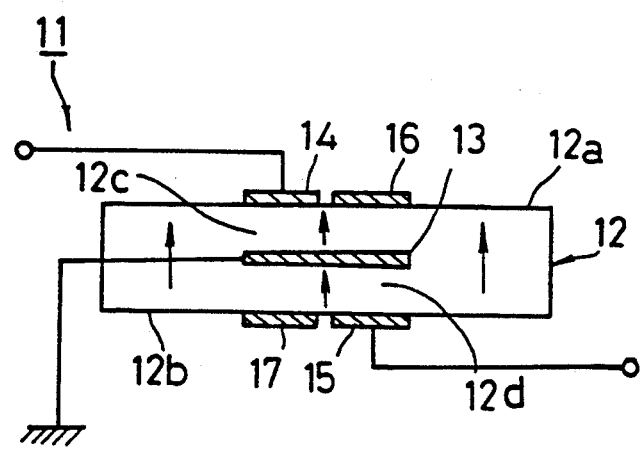
FIG. 1 is a schematic cross sectional view showing a piezoelectric filter according to one embodiment of the present invention.
Figure 2:
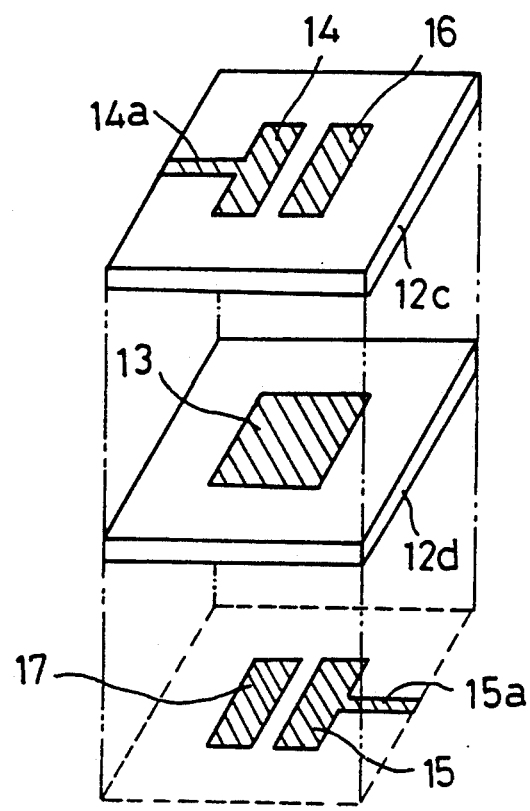
FIG. 2 is an exploded perspective view showing the piezoelectric filter shown in FIG. 1.

Referring to FIGS. 1 and 2, a piezoelectric filter according to one embodiment of the present invention will be described.

As shown in FIG. 1, in a piezoelectric filter 11 according to the present embodiment, an earth electrode 13 is provided in the center of a piezoelectric substrate 12 in the direction of thickness. The piezoelectric substrate 12 is polarized in the direction of thickness as indicated by the arrows. The earth electrode 13 is formed so as to have a rectangle plane shape as shown in FIG. 2 shows the piezoelectric filter 11 in an exploded manner.

On the upper surface 12a of the piezoelectric substrate 12, an input electrode 14 and a first dummy electrode 16 are formed. Referring to FIG. 2, the input electrode 14 is formed so as to be opposed to one part of the earth electrode 13 through a piezoelectric substrate layer 12c.

On the lower surface 12b of the piezoelectric substrate 12, an output electrode 15 and a second dummy electrode 17 are formed. The output electrode 15 is positioned so as to be opposed to the part of earth electrode 13 which does not overlap with the input electrode 14.

The first dummy electrode 16 is formed so as to be opposed to the output electrode 15 through the piezoelectric substrate 12, while the second dummy electrode 17 is formed so as to be opposed to the input electrode 14 through the piezoelectric substrate 12.

Although FIG. 2 shows that the input electrode 14 and the output electrode 15 are connected with electrode leader portions 14a and 15a, respectively, the electrode leader portions 14a and 15a are not necessarily required. As shown in FIG. 1, it is only necessary for the input electrode 14 and the output electrode 15 to be constructed so as to electrically connect to the exterior.

Figure 8:
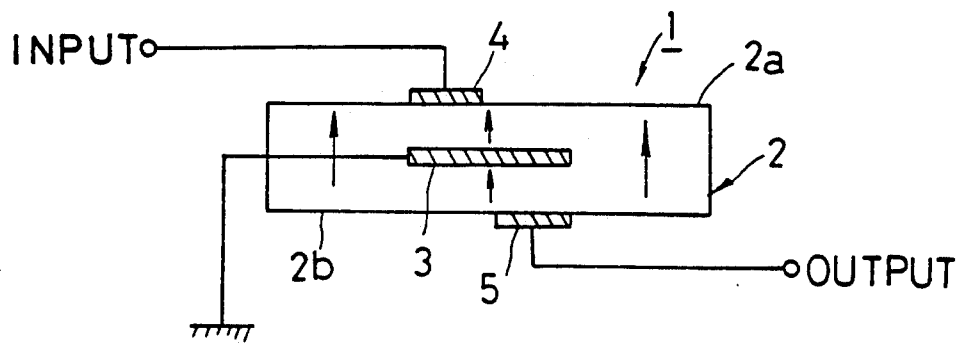
FIG. 8 is a schematic cross sectional view showing the conventional piezoelectric filter.
Figure 9:
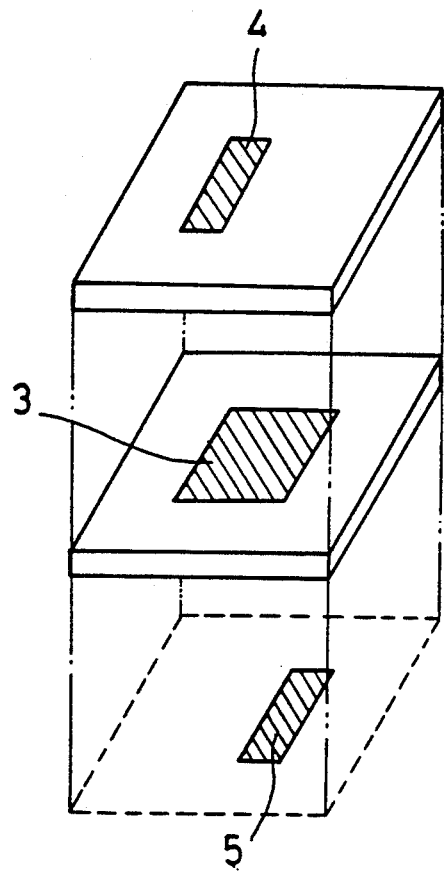
FIG. 9 is an exploded perspective view showing the conventional piezoelectric filter.

When actuating the piezoelectric filter 11, input voltage is applied between the input electrode 14 and the earth electrode 13, so as to excite the area in which the input electrode 14 and the earth electrode 13 are opposed to each other. Output voltage based on such excitation is outputted out in the area in which the earth electrode 13 and the output electrode 15 are opposed to each other. Thus, since the piezoelectric filter 11 is excited in both symmetric and asymmetric modes, it is actuated as a double-mode filter using a second harmonic wave of the thickness-extensional vibration mode, similar to a conventional piezoelectric filter using a second harmonic wave, as shown in FIG. 8.

In the piezoelectric filter 11 of the present invention, the reduction of insertion loss and the lowering of matching impedance are attained by the formation of the aforementioned first and second dummy electrodes 16 and 17. This will be described referring to FIGS. 3 to 6.

Figure 3:
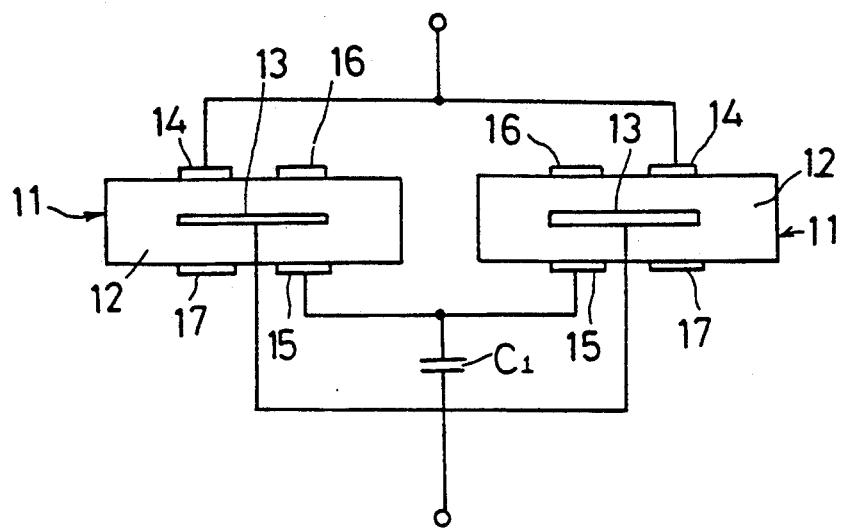
FIG. 3 is a schematic view showing a connection arrangement for measuring impedance-frequency characteristics of the symmetric mode of a two-element type of piezoelectric filter.
Figure 4:
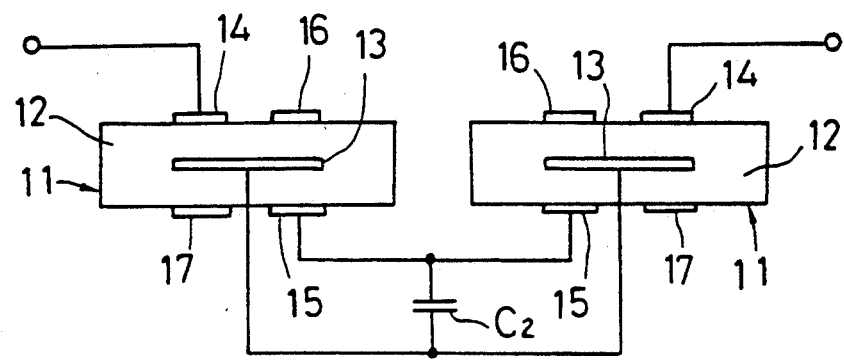
FIG. 4 is a schematic view showing a connection arrangement for measuring impedance-frequency characteristics of the asymmetric mode of the two-element type of piezoelectric filter.

As shown in FIGS. 3 and 4, impedance-frequency characteristics were measured with respect to symmetric and asymmetric modes of the two-element type of piezoelectric filter 11 of the above embodiment, which uses two piezoelectric filter elements. FIG. 3 is a schematic view showing an electrical connection arrangement for measuring impedance-frequency characteristics of the symmetric mode, and FIG. 4 is a schematic view showing an electrical connection arrangement for measuring impedance-frequency characteristics of the asymmetric mode. In FIGS. 3 and 4, $C_1$ and $C_2$ indicate coupling condenser values, respectively.

Figure 5:
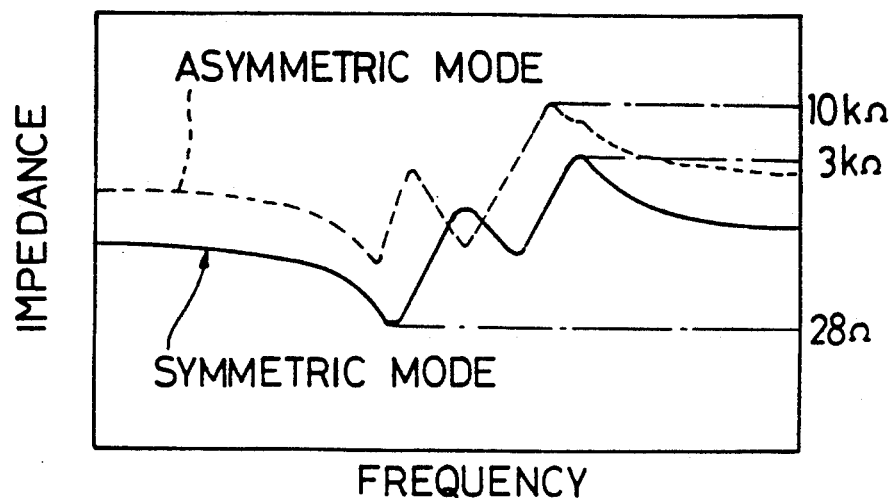
FIG. 5 is a diagram showing impedance-frequency characteristics of the symmetric and asymmetric modes of the two-element type of piezoelectric filter according to an embodiment of the present invention.
Figure 6:
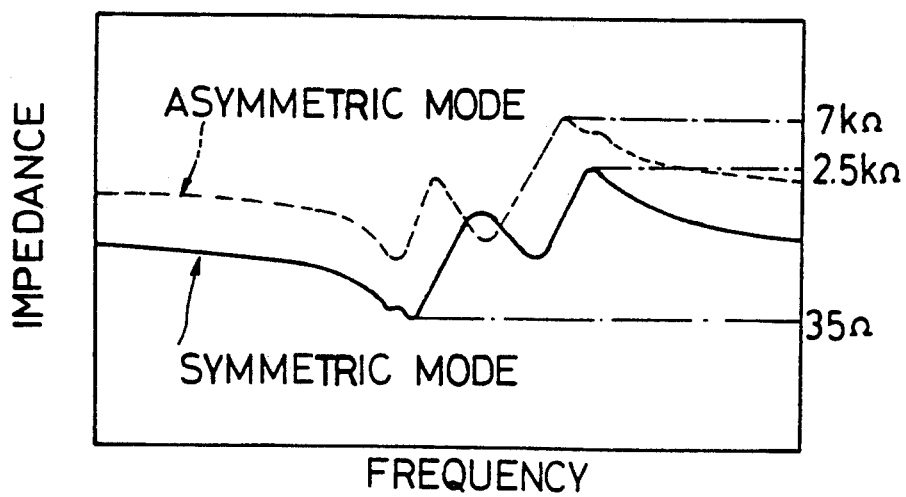
FIG. 6 is a diagram showing impedance-frequency characteristics of the symmetric and asymmetric modes of the conventional two-element type of piezoelectric filter.

FIG. 5 shows impedance-frequency characteristics of the symmetric mode and the asymmetric mode measured as described above. FIG. 6 shows comparative impedance-frequency characteristics of the symmetric mode and the asymmetric mode measured similarly for the conventional piezoelectric filter shown in FIG. 8. In FIGS. 5 and 6, the solid line indicates a curve of impedance-frequency characteristics in the symmetric mode and the broken line indicates a curve of impedance-frequency characteristics of the asymmetric mode.

A comparison of FIGS. 5 and 6 shows that the piezoelectric filter 11 of the present embodiment can obtain a large response in both symmetric and asymmetric modes compared to the conventional example. According to the experiments of the present inventors, it has been ascertained that insertion losses decrease by 1 to 2 dB as a result of enlarging a response in both symmetric and asymmetric modes by providing the aforementioned dummy electrodes 16 and 17. This is probably because in the piezoelectric filter 11 of the present embodiment, the symmetry of the electrode structure increases by providing the dummy electrodes 16 and 17, thereby improving the energy-trapped condition and raising the mechanical Q value.

A comparison of FIGS. 5 and 6 also shows that the piezoelectric filter 11 of the present embodiment has low impedance values in the region where the impedance-frequency characteristics curves of the symmetric mode and the asymmetric mode cross each other, and that such low impedance values provide low matching impedance. Therefore, it is understood that the impedance can be reduced effectively without increasing the electrode area of the input and output electrodes 14 and 15 and the earth electrode 13 by providing the dummy electrodes 16 and 17. Accordingly, the matching impedance can be reduced without increasing the level of unwanted spurious vibration.

Although the reductions of insertion loss and matching impedance are attained by the formation of the first electrode 16 and the second electrode 17, the size of the first and the second electrodes 16 and 17 is not required to be equal to those of the input and the output electrodes 14 and 15 as shown in the figure. In other words, the reductions of insertion loss and matching impedance can be attained, so long as the symmetry of electrode structure in the piezoelectric filter 11 is superior to that of the conventional filter.

According to the experiments of the present inventor, the effects of reducing insertion loss and matching impedance can be efficiently obtained when the effective overlapping areas of the first and the second electrodes 16 and 17, that is, the areas of the regions of the first and second electrodes 16, 17 that are overlapped with the earth electrode 13, are in the range of 20–200% of the effective overlapping areas of the input and the output electrodes 14 and 15. In the embodiment shown in FIG. 1, the entire area of one major surface of each of the first and second electrodes 16, 17 overlaps the earth electrode 13 through the piezoelectric substrate 12. Therefore, in this embodiment, the entire area of the respective major surfaces of the first and second electrodes 16, 17 are the effective overlapping areas and are in the range of 20 to 200% of the areas of the input and the output electrodes 14 and 15 that are overlapped with the earth electrode 13. When the area is less than 20% of the input and the output electrodes 14 and 15, the aforementioned reductions of insertion loss and matching impedance are not obtained efficiently. On the other hand, when it is more than 200%, the effects of reducing insertion loss and matching impedance are saturated and higher improvements are not obtained and, furthermore, the element becomes large-sized.

Figure 7:
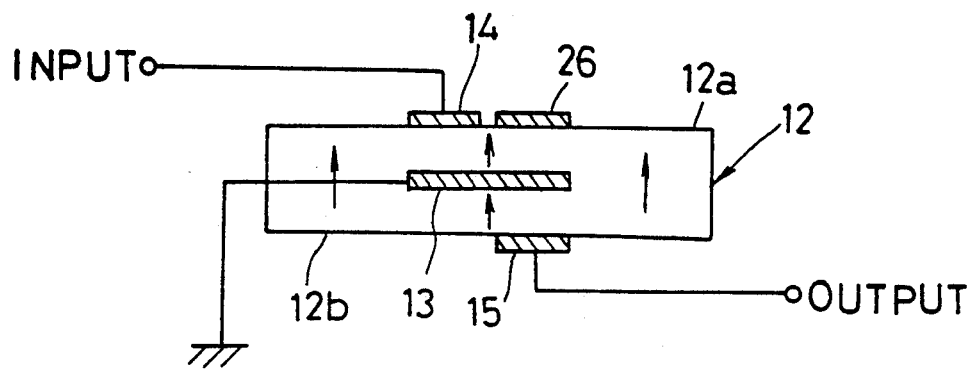
FIG. 7 is a schematic cross sectional view showing a piezoelectric filter according to another embodiment of the present invention.

Although, in the piezoelectric filter 11, the dummy electrodes 16 and 17 are formed on both major surfaces of piezoelectric substrate 12, a dummy electrode 26 may be formed only on the upper surface of piezoelectric substrate 12 without forming a dummy electrode on the lower surface, as shown in FIG. 7. Even such a structure has a higher symmetrical property of the electrode structure compared to the conventional piezoelectric filter shown in FIG. 8, so that the effects of reducing insertion loss and matching impedance can be obtained. Thus, in a piezoelectric filter according to the present invention, it is only required that the dummy electrode be provided on at least one of both major surfaces of piezoelectric substrate so as to overlap with the input electrode or the output electrode through the piezoelectric substrate.

What is claimed is:

1. A piezoelectric filter of an energy-trapped type utilizing a thickness-extensional vibration mode, comprising:
   a piezoelectric substrate having a first and a second major surface defining a thickness of said piezoelectric substrate therebetween;
   an earth electrode formed in said piezoelectric substrate so as to be in the center of said piezoelectric substrate along the direction of said thickness;
   an input electrode formed on said first major surface of said piezoelectric substrate so as to be opposed to one part of said earth electrode through a layer of said piezoelectric substrate;
   an output electrode formed on said second major surface of said piezoelectric substrate so as to be opposed to another part of said earth electrode other than said one part through a layer of said piezoelectric substrate; and
   a dummy electrode formed on at least one of said first and second major surface of said piezoelectric substrate so as to overlap with at least one of said output electrode and said input electrode through said piezoelectric substrate.

2. The piezoelectric filter according to claim 1, wherein dummy electrodes are formed on both said first and second major surface of said piezoelectric substrate.

3. The piezoelectric filter according to claim 1, wherein electrode leader portions are provided, said electrode leader portions being electrically connected with said input electrode and output electrode, respectively.

4. The piezoelectric filter according to claim 1, wherein an area comprising substantially a major surface of said dummy electrode overlaps with said earth electrode, said overlapping area of said dummy electrode being in the range of 20 to 200% of an overlapping area of one of said input electrode and said output electrode with said earth electrode.

5. The piezoelectric filter according to claim 4, wherein said overlapping area of said dummy electrode is equal to said overlapping area of one of said input electrode and said output electrode.

6. The piezoelectric filter according to claim 1, wherein at least a portion of said dummy electrode having a first overlapping area overlaps with said earth electrode, and at least one of said input and output electrode has a second overlapping area that overlaps with said earth electrode, said first overlapping area being in the range of 20 to 200% of said second overlapping area.

7. A piezoelectric filter of an energy-trapped type utilizing a thickness-extensional vibration mode for reducing insertion loss and matching impedance without increasing unwanted spurious vibration, the piezoelectric filter comprising:
   a piezoelectric substrate having a first and second major surface defining a thickness of said piezoelectric substrate therebetween;
   an earth electrode formed in said piezoelectric substrate so as to be in the center of said piezoelectric substrate along the direction of said thickness;
   an input electrode formed on said first major surface of said piezoelectric substrate so as to be opposed to a one part of said earth electrode through a layer of said piezoelectric substrate;
   an output electrode formed on said second major surface of said piezoelectric substrate so as to be opposed to another part of said earth electrode other than said one part through a layer of said piezoelectric substrate; and
   a dummy electrode formed on at least one of said first and second major surface of said piezoelectric substrate so as to overlap with at least one of said output electrode and said input electrode through said piezoelectric substrate, wherein an area of said dummy electrode overlaps with said earth electrode, said overlapping area of said dummy electrode being in the range of 20 to 200% of an overlapping area of one of said input electrode and said output electrode with said earth electrode.

8. The piezoelectric filter according to claim 7, wherein dummy electrodes are formed on both said first and second major surface of said piezoelectric substrate.

9. The piezoelectric filter according to claim 7, wherein electrode leader portions are provided, said electrode leader portions being electrically connected with said input electrode and output electrode, respectively.

10. The piezoelectric filter according to claim 7, wherein said overlapping area of said dummy electrode is equal to said overlapping area of one of said input electrode and said output electrode.

* * * * *